United States Patent [19]

Graham

[11] 4,176,028
[45] Nov. 27, 1979

[54] PLASTISOLS MADE WITH POLYELECTROLYTE BINDERS

[75] Inventor: Boynton Graham, Wilmington, Del.

[73] Assignee: E. I. Du Pont de Nemours and Company, Wilmington, Del.

[21] Appl. No.: 780,086

[22] Filed: Mar. 22, 1977

[51] Int. Cl.$^2$ .................................... C08F 263/00
[52] U.S. Cl. .................... 204/159.16; 204/159.15; 260/31.8 M; 260/33.8 UA
[58] Field of Search ............... 96/35.1, 115 P, 115 R; 204/159.16, 159.14; 260/33.8 UA, 885, 31.8 M

[56] References Cited

U.S. PATENT DOCUMENTS

| | | | |
|---|---|---|---|
| 2,892,712 | 6/1959 | Plambeck | 96/35.1 |
| 2,893,868 | 7/1959 | Barney | 96/115 R |
| 2,986,507 | 5/1964 | Steck | 204/159.16 |
| 3,413,973 | 1/1947 | Howk et al. | 204/159.16 |
| 3,833,384 | 9/1974 | Noonan et al. | 96/115 P |
| 3,887,450 | 6/1975 | Gilano | 204/159.15 |
| 4,025,346 | 5/1977 | Petke et al. | 204/159.16 |

*Primary Examiner*—Wilbert J. Briggs, Sr.

[57] ABSTRACT

Thermally coalescible plastisols and organosols of the invention comprise dispersions of single-phase particles of random polymers or copolymers that comprise organic polyelectrolytes that contain at least 1% by weight of ionizable monomer or comonomer, dispersed in a medium that comprises a nonvolatile liquid that is compatible with the resin. Incorporation of a photopolymerizable, ethylenically unsaturated compound provides photosensitive plastisols and organosols useful for making relief and planographic printing plates, photoresists, and the like.

11 Claims, No Drawings

PLASTISOLS MADE WITH POLYELECTROLYTE BINDERS

BACKGROUND OF THE INVENTION

1. Field of the Invention

This invention relates to nonaqueous resin dispersions and particularly to polyelectrolyte resin plastisols and organosols. This invention also relates to photosensitive polyelectrolyte resin plastisols and organosols that contain a photopolymerizable ethylenically unsaturated compound.

2. Description of the Prior Art

Cetain polymeric resins referred to as plastisols are fluid mixtures, ranging in viscosity from pourable liquids to heavy pastes, obtained by dispersing polymeric resin particles in nonvolatile, nonaqueous liquid plasticizers, i.e., materials which are compatible with the polymer or resin and increase its workability and flexibility but are not solvents for the resin or polymer under ordinary conditions of storage. When the plastisol has been formed into a desired shape, e.g., by molding or coating, it can be heated to coalesce the polymeric resin particles and the nonvolatile liquid constituent, thereby forming a homogeneous mass. Volatile diluents can be added to plastisol dispersions to modify their viscosity and to achieve desirable handling characteristics in coating or other forming operations. When the dispersion contains no more than 10% volatile diluent, it is still regarded as a plastisol; when the volatile diluent content exceeds 10%, the dispersion is defined as an "organosol", H. A. Sarvetnick, "Plastisols and Organosols", Van Nostrand Reinhold Company, New York (1972), page 201.

Theoretically, by appropriate choice of ingredients, any polymeric resin can be made into a plastisol. In practice, however, both the commercial use and the technical literature have focused almost exclusively on the use of polyvinyl chloride in forming plastisols, to the extent that "plastisol" is cross-referenced to "polyvinyl chloride" in *Chemical Abstracts* and in many textbooks plastisols are described as suspensions of polyvinyl chloride resin.

The pre-eminence of polyvinyl chloride in the practical and technical plastisol art results from the fact that many polymers with otherwise highly useful and desirable characteristics can be dispersed in suitable plasticizers only with great difficulty to give dispersions that have impractically high initial viscosities or very short storage life or both. It has now been found that plastisols and organosols of reduced initial viscosity and enhanced stability against room temperature gelation can be produced when polymers that contain ionogenic groups are first converted to their salts and then dispersed in plasticizers. Dispersions made in this way are amenable to a variety of forming techniques with all of the economic, ecological, health and safety advantages attendant on solvent-free operation. They can be made photosensitive by incorporation of a nonvolatile, photopolymerizable, ethylenically unsaturated compound as part of the plasticizer component of the dispersion, and used for the manufacture of relief and planographic printing plates, photoresists for the manufacture of printed circuits, and the like.

It is known from U.S. Pat. No. 3,309,330 to use terpolymers of vinyl chloride/acrylate/acrylic or methacrylic acid in aqueous dispersions that may contain a plasticizer as well as ammonium hydroxide. Such dispersions, however, are not polyelectrolyte resin plastisols or organosols. French Pat. No. 73.06503 teaches how to disperse multiple-phase polymers, including ionomers, in a mixture of polar and nonpolar plasticizers. Aqueous dispersions of polyelectrolyte resins in silver-halide-based photosensitive compositions and elements are disclosed in U.S. Pat. Nos. 1,981,102 (polyelectrolyte as hydrophilic binder for silver halide emulsion) and 3,811,897 (polyelectrolyte as viscosity-increasing additive in aqueous dispersions of hydrophilic colloids). U.S. Pat. No. 2,893,868 discloses photosensitive compositions and elements that comprise potopolymerizable, ethylenically unsaturated monomers in conjunction with polyelectrolyte resins and plasticizers dissolved in organic solvents. The compositions are solutions rather than dispersions.

SUMMARY OF THE INVENTION

In accordance with this invention, a thermally coalescible nonaqueous resin dispersion of single-phase particles of a random polymer or copolymer is prepared which comprises an organic polyelectrolyte that contains at least 1% by weight of ionizable monomer or comonomer, dispersed in a medium that comprises a liquid that is nonvolatile at room temperature and is compatible with the resin.

DESCRIPTION OF THE PREFERRED EMBODIMENT

The term "polymer" as used herein includes both homopolymers and copolymers, and the term "copolymer" is not restricted to polymers derived from only two monomeric species but also includes terpolymers, tetrapolymers, and the like. The polymers suitable for use as the resin component in the dispersions of this invention are those in which only one phase is present in the polymer particles, as evidenced by the fact that films cast from solutions of the polymers are clear.

The resin component of the dispersions of this invention is any polymer or copolymer that comprises an organic polyelectrolyte that contains at least 1% ionizable monomer or comonomer. Preferably the organic polyelectrolyte comprises at least 50% by weight of the polymer or copolymer. The organic polyelectrolyte portion of the resin is the salt of any polymer or copolymer containing ionogenic acidic and/or basic moieties. Thus, in the final dispersion of the invention, the resin may be the ionic form of any homopolymer or copolymer derived in whole or in part from any monomer having available salt-forming reactive groups, either acidic or basic, so long as the quantitative requirements set forth above are met. A preferred group of resins are the ionic acrylic resins, especially those containing at least 80% by weight of acrylic units. More particularly preferred are the salts of methyl methacrylate/methacrylic acid copolymers in the ratios, by weight, of 80/20 to 99/1 and still more preferably 90/10 to 98/2. It is often desirable that the final product to be formed from a plastisol or organosol dispersion of this invention have properties characteristic of nonionic resins. In such cases, it will be preferred that the ionic resins be salts of either weak acids or weak bases, preferably both, since such compositions tend to revert to the nonionic form when heated, as in the coalescing step.

Many monomers, polymers and copolymers suitable for use in the practice of this invention are well known to those skilled in the polymer art, as are also procedures for preparation of the monomers and for polymerization of the monomers to homopolymers and copolymers of desired compositions, as well as methods for converting the polymers to their ionic forms, i.e., to their salts. These aspects, per se, are not part of the present invention.

Among the suitable monomers having basic reactive groups, a preferred class are those having amine substituents, and especially tertiary amines. Homopolymers and copolymers made from these monomers are readily converted to their ionic form by reaction with acids, conveniently, for example, with hydrochloric acid. Representative useful monomers are 2-vinylpyridine, 2-methyl-5-vinylpyridine, $\beta$-dimethyl- and $\beta$-diethylaminoethyl methacrylates, and the like. Useful polymers are the homopolymers of these monomers and their copolymers with such other monomers as styrene and methyl methacrylate. Other suitable basic ionogenic polymers are disclosed in U.S. Pat. No. 3,558,492, British Pat. No. 1,168,182, and published Netherlands Application No. 71.17375.

Suitable monomers having acidic reactive groups include those having lateral carboxylic, sulfonic, or phosphoric acid groups. Homopolymers and copolymers made from these monomers are readily converted to their basic salts, e.g., alkali metal salts, ammonium salts, and amine salts, by treatment with alkali metal hydroxides, ammonium hydroxide, gaseous $NH_3$, dimethyl cocoamine, triethylamine, dimethyloctylamine, triethanolamine, triethylene tetramine, and the like. A particularly useful and preferred class of monomers are such unsaturated carboxyl-containing monomers as acrylic, methacrylic, cinnamic, crotonic, sorbic, itaconic, propiolic, maleic and fumaric acids and, where possible, their corresponding half-esters and anhydrides. Representative useful polymers include copolymers of: acrylic or methacrylic acids with styrene, lower alkyl ($C_1$ to $C_4$) acrylates and methacrylates, vinyl chloride, acrylonitrile; itaconic acid with styrene or with said lower alkyl acrylates and methacrylates; styrene/maleic anhydride and styrene/monobutyl maleate; vinyl acetate/crotonic acid; methyl vinyl ether/maleic anhydride and half-esters thereof, e.g., monobutyl. Other examples of useful polymeric carboxylic acids and the mixed polymerization products of those acids, and of their salts, are given in U.S. Pat. Nos. 1,981,102; 2,760,886; 2,772,166; 2,848,434; 3,309,330; British Pat. No. 1,361,298; French Pat. No. 72.10954, and in the other patents mentioned therein.

Among the useful acidic ionogenic monomers having reactive sulfonic acid substituents are the sulfonated styrenes, as well as the monomers and polymers (and salts thereof) described in U.S. Pat. Nos. 3,168,403; 3,241,969; 3,411,911; 3,536,491; 3,592,655 and 3,811,897, and in the other patents mentioned therein.

Still other suitable polymers containing lateral ionogenic groups, both acidic and basic, and their conversion to salts, are described in U.S. Pat. No. 2,893,868.

The selection of monomeric components, and their relative proportions in copolymers, will be determined by such factors as (a) the properties desired in the final product that is to be made from the plastisol or organosol, (b) cost, (c) availability, (d) the ease with which they can be handled in the various process steps to be used, (e) their compatibility with the plasticizers and other constituents intended to be used, and the like.

The polymers may be prepared by any of the methods familiar to polymer chemists, e.g., by bulk, emulsion, suspension, or seed polymerization. Several useful techniques are illustrated in the examples that follow. The method of making the polymer is not a part of the present invention, but will, as recognized, have an effect on such characteristics as the inherent viscosity of the polymer and the size of the polymer particles produced. The inherent viscosity ($\eta_{inh}$) of the polymer is not a critical factor, but for convenient practical operation will preferably be in the range 0.1–1.5 and more preferably 0.2–1.2. When polymer viscosity is high, the dispersion will be more difficult to coalesce; when polymer viscosity is low, the form stability of the final coalesced product may be affected adversely. Particle size, expressed as means diameter of the particles, is likewise not critical, but for convenient practical operation will preferably be in the range 0.1–20 $\mu$m and more preferably 0.5–10 $\mu$m. The desirable particle size in a given instance will be governed in part by the characteristics sought in the final product and by the forming procedure to be employed. Very large particles may limit the minimum thickness of coatings that can be made from dispersions containing them, and may also require fusion or coalescence times that are unattractively long and/or severe. Very small particles, e.g., <0.1 $\mu$m, are operable, but their large available surface area tends to make them susceptible to rapid gelation with consequent short storage life, and to require large amounts of plasticizer that result in low solids/liquid ratios that are inefficient and undesirable for practical operations. Particle sizes in the desired range in a given instance may be obtained either directly, by choice of an appropriate polymerization procedure, or by grinding or milling large particles to produce smaller ones, in equipment and by techniques known in the art.

It will generally be preferable to have the polymer in its ionic form before incorporating it in the plastisol or organosol dispersion. However, it is also possible to use a polymer in nonionic form as the starting material and to convert it to the ionic form in situ by incorporating suitable ionogenic reactants with the plasticizer and optional other ingredients with which the polymer will be mixed to form the final dispersion.

To make the dispersions of this invention, the polymer particles which may be surfactant-free, are dispersed in a medium that also may be surfactant-free and that comprises a plasticizer for the polymer particles, that is, a compatible liquid that is nonvolatile at room temperature and is not a solvent for the polymer under ordinary storage conditions but that is capable of interacting physically with the polymer in such a way as to reduce the mutual attractive forces between polymer chains, thereby increasing the workability and flexibility of the polymer. The plasticizer can be chosen from a large number of substances known to be plasticizers for polymers, e.g., phosphates, phthalates, sebacates, ricinoleates, adipates, etc. Plasticizers are discussed in Sarvetnick, "Plastisols and Organosols", Van Nostrand Reinhold Company, New York (1972), Chapter 3, pp. 33–59. Representative materials include: triallyl, tributyl and tricresyl phosphates; dibutyl, dicapryl and dioctyl phthalates; and others shown in the examples hereinafter. Plasticizers that contain ether groups are operable, but are generally not preferred because they appear to have an adverse effect on viscosity stability and shelf life of the polymer dispersions. Preferably the liquid medium is free of surfactants that contain ether groups or that are based on long-chain acids ($C_{10}$ to $C_{28}$); surfactants based on long-chain amines ($C_{10}$ to $C_{28}$) are acceptable.

The dispersing medium may also contain a volatile component, preferably one that is a solvent or swelling agent for the polymer component of the dispersion. Incorporation of a volatile component provides an additional means of controlling the viscosity of the dispersion and may frequently facilitate the forming operation, e.g., coating, and improve the rheology of the dispersion. Representative materials are methyl chloroform, chloroform, methylene chloride, and others shown in the examples. Following known practice, dispersions wherein the volatile component comprises no more than 10% by weight of the total weight of the dispersion are regarded herein as plastisols, whereas dispersions wherein the volatile component comprises more than 10% by weight of the total weight of the dispersion are defined as organosols.

The loading factor or amount of polymer solids in the liquid dispersing medium will be governed by practical factors relating to operating convenience. For coatability, ease of stirring, and the like, a preferred upper limit for the solids/nonvolatile liquid ratio is 60/40, and more preferred is about 50/50, for the plastisol dispersions. This consideration is less important for the organosol dispersions where solids/nonvolatile liquid ratios of 80/20 and even 90/10 are feasible, inasmuch as any desired amount of volatile component can be incorporated to give a workable viscosity and then removed by evaporation by heating in the course of arriving at the desired temperature for fusing or coalescing the dispersion.

For the photosensitive dispersions and elements that are particularly preferred embodiments of this invention, the liquid portion of the dispersion will contain a nonvolatile, photopolymerizable, ethylenically unsaturated compound together with any required or desired photoinitiator component(s), chain transfer agents, hydrogen donors, dyes and other conventional additives, all selected from the many materials known for their respective purposes in the photopolymer art and not forming, per se, a part of the present invention. A wide variety of suitable materials for use as photopolymerizable monomers, photoinitiators, and the other components just mentioned is disclosed in a number of patents dealing with the photopolymer art, conveniently, for example, in Gramas U.S. Pat. No. 3,784,378. Among the preferred photopolymerizable monomers are a number of polyfunctional acrylic and methacrylic monomers, such as triethylene glycol diacrylate and dimethacrylate, tetraethylene glycol diacrylate and dimethacrylate, hexamethylene glycol diacrylate and dimethacrylate, polyethylene oxide diacrylate and dimethacrylate, polyethoxy trimethylolpropane triacrylate, trimethylolpropane triacrylate and trimethacrylate, tetramethylene glycol dimethacrylate, and decamethylene glycol dimethacrylate. Monomers that contain ether groups are operable, but ether-free monomers are preferred for viscosity stability of the dispersion. When a photopolymerizable acrylic monomer is used, it should preferably not be a manomer of any of the already-polymerized component, i.e., the polymer resin that is dispersed in the liquid component, in order to insure against excessive plasticization and consequent gelation at storage temperatures. Thus, for example, the salt of a methyl methacrylate/methacrylic acid copolymer may be dispersed in a liquid that contains trimethylolpropane trimethacrylate as one component of the liquid portion.

It is important that any photopolymerizable monomer that may be included in the dispersion shall also contain a thermal polymerization inhibitor in an amount adequate to prevent premature polymerization of the monomer in response to the heat that may be encountered in stirring and especially in the coalescence step, thereby insuring that polymerization of the monomer occurs only when wanted as a consequence of photoexposure of the completed photosensitive element. The commercially available polymerization-grade monomers conventionally contain thermal polymerization inhibitors in an amount adequate for this purpose.

The plastisols and organosols of the invention may be formed into articles by any of the forming procedures ordinarily used, e.g., by coating, extrusion, molding, and dipping. The forming method is not a part of the present invention. In the preferred embodiment of photosensitive elements, the dispersions of the invention may be cast or extruded to form self-supporting elements, or they may be cast or coated on transparent or nontransparent substrates to form supported photosensitive elements. A number of suitable substrates are disclosed in the examples hereinafter and in the aforementioned Gramas U.S. Pat. No. 3,784,378, and are otherwise well-known to those familiar with the general art of photosensitive elements. The particular substrates used and the particular structure of photosensitive elements or other objects formed from the dispersions of this invention are not part of the invention.

A variety of polymers and copolymers, when converted to their ionic forms, can be dispersed in a variety of compatible liquid media to form fluid plastisols having solids/nonvolatile liquid ratios of 50/50 or greater. Diluents can be added to these dispersions to give organosols that may have substantially higher ratios of solids to liquids. For both plastisols and organosols, there may be incorporated a variety of photopolymerizable monomers to permit the formation of photoimageable coatings and the like, useful for a variety of applications, such as relief and planographic printing plates, photoresists, and the like.

EXAMPLES OF THE INVENTION

The invention will be illustrated by the examples that follow, wherein parts and percentages are by weight unless otherwise noted. Data on the inherent viscosity of polymers ($\eta_{inh}$) refer to the inherent viscosities of solutions of 0.25 g polymer in 50 ml solvent, either chloroform or 50/50 (by volume) chloroform/methanol, measured at 25° C. with a No. 50 Cannon-Fenske viscometer. Particle size values are mean particle diameters determined by inspection of photomicrographs or electron micrographs. Dispersion viscosities, reported in centipoises (cps.) were measured with a Brookfield RVT viscometer with a No. 5 spindle. All monomers used in the examples, either to make the ionogenic resin polymers or to serve as photopolymerizable monomers in photosensitive dispersions, were commercially available polymerization-grade monomers containing conventional amounts of polymerization inhibitors. Dyes are identified by C. I. name and number as given in "Colour Index", Third Edition, The Society of Dyers and Colourists, Bradford, Yorkshire, England (1971). Performance of photosensitive elements was measured by exposing them through a conventional graphic arts resolution guide, i.e., a series of transparent parallel lines of known width in a nontransparent background, and a series of transparent converging lines separated by nontransparent spacing areas of known width, then removing the unpolymerized composition from the unexposed areas. Performance is evaluated on the basis of the minimum width of polymerized parallel lines that can be faithfully reproduced, and of the minimum spacing that can be obtained without plugging between polymerized converging lines. Filters and sieves are identified in terms of mesh (number of openings per inch) and sieve opening (mm or μm) according to Table 21-16 on page 21-51 of Perry, "Chemical Engineers' Handbook", Fourth Edition, McGraw-Hill Book Company, New York (1963).

EXAMPLE 1

A methyl methacrylate/methacrylic acid (90/10) copolymer ($\eta_{inh}=0.12$) was made by conventional suspension polymerization in water with polymethacrylic acid as the suspending agent. The resultant spherical particles were about 0.004–0.005 inch (100–125 μm) in diameter. The polymer was dry-milled in a ball mill with an equal volume of flint pebbles having a diameter of one-half inch (~12.5 mm) for four days. The resultant product was an impalpable powder of 2–20 μm particle size. The powder was soluble at room temperature in methylene chloride, chloroform, 1,2-dichloroethane, trichloroethylene, 1,1,2-trichloroethane and 1,2,3-trichloropropane. It was partly soluble, swollen and agglomerated in methyl chloroform, insoluble but swollen in perchloroethylene and carbon tetrachloride, and insoluble and not swollen in hexane. Films cast from chloroform/methanol (1/1 by volume) were clear.

The milled powder was stored in a closed container over concentrated aqueous ammonium hydroxide for 20 hours at room temperature, then air-dried for four hours. Weight gain was 4.5%. A Kjeldahl analysis for nitrogen indicated 0.4%, equivalent to about 30% conversion of —COOH to —COONH$_4$. The powder was then soluble at room temperature in methylene chloride, chloroform, trichloroethylene, 1,1,2-trichloroethane and 1,2,3-trichloropropane. It was partly soluble, swollen and agglomerated in methyl chloroform and 1,2-dichloroethane, insoluble but swollen in perchloroethylene and carbon tetrachloride, and insoluble and not swollen in hexane.

An 11.6 g sample of the ammonia-treated powder was added to a prefiltered mixture of 8.75 g trimethylolpropane triacrylate, 3 g tricresyl phosphate, 1 g triethylene glycol diacetate, 1 g bis[2-o-chlorophenyl-4,5,bis(m-methoxyphenyl)]imidazole, 0.05 g leuco crystal violet, 0.05 g benzotriazole, 0.0375 g C. I. Solvent Red 109 (C. I. No. 13900/45170), and 0.0125 g Michler's ketone. After stirring for 15 minutes at room temperature, the smooth fluid plastisol had a Brookfield No. 5 viscosity of 6200 cps. Viscosity was 9400 cps. after 4 hours and 25,920 cps. after 24 hours. Essentially similar results were obtained when similar milled powders were stored over ammonium hydroxide for 6 hours and for 3 days at room temperature.

The plastisol was coated at a doctor knife clearance of 0.004" (0.1 mm) on 0.001"-thick (0.025 mm) polyethylene terephthalate film and heated for 5 minutes at 120° C. It coalesced to a smooth, dry, clear film having a thickness of 0.002" (0.05 mm). It was laminated to a copper-foil-coated phenolic circuit board at 100° C., exposed through a graphic arts resolution guide as previously described for one minute to radiation from a nuArc ® Plate Maker of the flip-flop type, Model No. FT-26L, manufactured by the nuArc Co., Inc., Chicago, Ill. The polyethylene terephthalate support was then removed and the exposed coating was developed with a solution of 10 g of the monobutyl ether of ethylene glycol plus 1 g of borax in 90 g of water. A clean, sharp resist pattern was obtained. The board was cleanly etched with commercial ferric chloride etchant, and the resist was easily stripped with methylene chloride.

By comparison, another sample of the same milled methyl methacrylate/methacrylic acid (90/10) powder was not treated with ammonia, and was used to make a plastisol otherwise having the same formulation as just described. This plastisol had an initial viscosity of 11,000 cps., and a viscosity of 48,000 cps. after 24 hours.

EXAMPLE 2

Preparation of Binder Powder

To a solution of 0.4 g ammonium persulfate in 200 g water was added 18 ml of a solution of 1.09 g dodecyl mercaptan and 10.0 g methacrylic acid in 100 g methyl methacrylate. The suspension was stirred vigorously under nitrogen and heated to 80°–85° C. At intervals of 30 minutes, there was added 25 ml of the methyl methacrylate/methacrylic acid/dodecyl mercaptan solution and 112 ml of a solution of 0.2 g ammonium persulfate in 450 g water. Thirty minutes after the fourth such addition, the reactor was opened to the air and cooled to room temperature. The latex was evaporated at 55°–66° C. under nitrogen with stirring, and the residual powder was ground in a mortar, passed through a 40-mesh (~0.38 mm) sieve, and held for 3 days in a closed container over concentrated aqueous ammonium hydroxide. The powder was soluble at room temperature in chloroform and 1,1,2-trichloromethane; partly soluble, swollen and agglomerated in methylene chloride, 1,2-dichloroethane, trichloroethylene and 1,2,3-trichloropropane. It was swollen but insoluble in methyl chloroform, perchloroethylene and carbon tetrachloride. It was insoluble and not swollen in hexane.

Preparation of Plastisol

An 11.1 g sample of the binder powder prepared as just described was added to a mixture of 8.75 g trimethylolpropane trimethacrylate, 2.00 g tricresyl phosphate, 1.00 g bis(2-o-chlorophenyl-4,5-diphenyl)imidazole, 0.05 g leuco crystal violet, 0.05 g benzotriazole, 0.0375 g C. I. Solvent Red 109, 0.0125 g Michler's ketone, and 5 ml methyl chloroform. An equal volume of 20–30 mesh (~0.55–0.85 mm) sand was added, and the mixture was milled for 30 minutes at 0° C. with a disc impeller running at a peripheral speed of 1000 ft./min. (~300 m/min.). The dispersion was held for three days at room temperature. It became more fluid, and was pressure-filtered through nylon flannel. The resultant organosol had a viscosity of 488 cps. It was held for 30 minutes under a vacuum of 3.5 mm Hg to eliminate air bubbles and remove most of the methyl chloroform diluent. The resultant plastisol had a viscosity of 1920 cps. It remained fluid for 12 days or more at room temperature. Both initially and after storage for a period of at least 12 days, it was readily coated, coalesced, imaged, developed, etched and stripped as in Example 1.

Substantially similar results were obtained when the methyl chloroform diluent was replaced by other chlorinated hydrocarbons that were solvents or swelling agents for the binder, e.g., chloroform, tetrachloroethylene, methylene chloride, trichloroethylene and carbon tetrachloride, but not with hexane, which did not swell or dissolve the binder.

EXAMPLE 3

An ammonia-treated methyl methacrylate/methacrylic acid (99/1) copolymer binder powder was prepared substantially as described in Example 2, except that 4.0 g of dodecyl mercaptan was used in the monomer solution, which comprised 99 g methyl methacrylate and 1 g methacrylic acid, and that 5% of a seed latex polymer of poly(methyl methacrylate) similarly prepared was incorporated in the reaction mixture.

An organosol was prepared as described in Example 2, using 12.84 g of the binder powder, 9.75 g trimethylolpropane trimethacrylate, 1.50 g tricresyl phosphate, 0.50 g triethylene glycol diacetate, 0.0825 g Michler's ketone, 0.165 g benzophenone, 0.05 g benzotriazole, 0.1125 g C. I. Solvent Red 109, and 4.5 ml carbon tetrachloride. Immediately after the sand-milling, the dispersion was filtered through a 325-mesh (0.044 mm) screen. It had a viscosity of 560 cps. as prepared, and 4280 cps. after evacuation. It was coated, coalesced, laminated, imaged, developed, etched and stripped as in Example 1.

By comparison, an organosol of the same composition but made with methyl methacrylate/methacrylic acid (99/1) powder that had not been treated with ammonia tended to coalesce during the milling cycle and could not be filtered.

In further contrast, similar organosols made with poly(methyl methacrylate) homopolymer, i.e., a nonionogenic polymer, could scarcely be milled and filtered, even with twice as much carbon tetrachloride diluent, whether or not the binder powder had been treated with ammonia.

EXAMPLE 4

A methyl methacrylate/ethyl acrylate/methacrylic acid (65/25/10) terpolymer binder powder was prepared according to the procedures described in Example 2, except that no dodecyl mercaptan was used, 2.5% of a seed latex methyl methacrylate/ethyl acrylate/methacrylic acid (61/31/8) was incorporated in the reaction mixture, and the polymer powder was isolated by drying the latex at room temperature. The dried powder was ammonia-treated in the manner described in preceding examples. A plastisol was made from the ammonia-treated powder in the formulation described in Example 2. It was held for three days in a refrigerator at 5° C., then was strained through a 40-mesh (~0.38 mm) screen at 0° C. It was stable against gelation for about 24 hours at room temperature. It was coated, coalesced, imaged, developed, etched and stripped as described in Example 1.

EXAMPLE 5

Preparation of Binder Powder

A solution of 0.8 g ammonium persulfate and 0.5 g sodium lauryl sulfate in 200 ml water was stirred vigorously and heated under nitrogen at 80°–86° C. and 26 ml of a solution of 9 g dimethylaminoethyl methacrylate in 90.7 g styrene was added. At two-hour intervals, further additions were made of 20 ml of the monomer solution and 112 ml of a solution of 0.4 g ammonium persulfate and 0.5 g sodium lauryl sulfate in 450 g water. Forty-seven minutes after the second addition, the reaction mass was diluted with methanol and filtered. The filter cake was washed three times with methanol, air-dried, ground in a mortar, and passed through a 40-mesh (~0.38 mm) sieve and held for 20 hours in a closed contained over concentrated aqueous hydrochloric acid.

Preparation of Plastisol

Two grams of the powder so prepared were stirred into 8 g of trimethylolpropane trimethacrylate. The resultant opaque, dilatant plastisol had a viscosity of 12,000 cps. after two hours at room temperature. By comparison, a similar plastisol made with a sample of the styrene/dimethylaminoethyl methacrylate (91/9) powder that had not been treated with hydrochloric acid had a viscosity of 52,800 cps. after 2 hours at room temperature.

EXAMPLE 6

A solution of 0.4 g ammonium persulfate and 0.25 g sodium lauryl sulfate in 50 g water was stirred vigorously, heated under nitrogen to 85°–90° C., then was added 9.3 ml of a solution of 4.8 ml 2-methyl-5-vinylpyridine and 4.5 ml dodecyl mercaptan in 100 ml styrene. At intervals of 7, 10, 15 and 16 minutes, further additions were made of 25 ml of the styrene/2-methyl-5-vinylpyridine/dodecyl mercaptan solution and 110 ml of a solution of 0.20 g ammonium persulfate plus 0.25 g sodium lauryl sulfate in 500 g water. Two hours after the fourth such addition, there was added a solution of 0.5 g dodecyl mercaptan in 4.8 ml 2-methyl-5-vinylpyridine plus 20 ml of the aqueous ammonium persulfate/sodium lauryl sulfate solution. After a further 45 minutes at 90° C., the reaction was terminated by admitting air and cooling to room temperature. The latex was strained through nainsook fabric and dried for 20 hours on a steam bath under nitrogen with stirring. The white solid residue was ground in a mortar, passed through a 40-mesh (~0.38 mm) sieve, held 24 hours at room temperature under vacuum, held for 20 hours in a closed contained over concentrated aqueous hydrochloric acid, and air-dried for five hours.

A plastisol was prepared by stirring 5 g of the powder into 10 g of trimethylolpropane trimethacrylate. Viscosity was 3600 cps. initially and 7400 cps. after one hour. When the plastisol was spread on glass and heated for 5 min. at 120° C. it coalesced to a clear, coherent film. By comparison, a plastisol of similar composition but made with another sample of the same powder that had not been treated with hydrochloric acid had a viscosity of 13,200 cps. after one hour.

EXAMPLE 7

A 10.6 g sample of the milled methyl methacrylate/methacrylic acid (90/10) powder described in Example 1 was tumbled for 24 hours with 0.5 g of dimethyl cocoamine and was then used to make a plastisol by the procedure of Example 2, using 8.75 g trimethylolpropane trimethacrylate, 2.00 g of tricresyl phosphate, 2.00 g dibutyl phthalate, 1.00 g bis(2-o-chlorophenyl-4,5-diphenyl) imidazole, 0.05 g leuco crystal violet, 0.05 g benzotriazole, 0.0375 g. C. I. Solvent Red 109, and 0.0125 g Michler's ketone. The plastisol was passed through a 200-mesh (0.074 mm) screen and debubbled under vacuum. It had a viscosity of 3300 cps. and was readily coated, coalesced, laminated, imaged, developed, etched and stripped as in Example 1. By comparison, a plastisol of the same composition made from powder that had not been tumbled with dimethyl cocoamine had a viscosity of 5920 cps. In a similar procedure using triethylene tetramine instead of dimethyl cocoamine, milling was difficult to accomplish and the plastisol was very thixotropic, showing that polyfunctional amines, although operable, are less effective, hence, less preferred, than monofunctional amines.

EXAMPLE 8

A plastisol was made as in Example 7, except that the dimethyl cocoamine was incorporated directly into the mixture of other ingredients, thereby providing for in situ conversion of the ionogenic polymer to its salt. The sand-milled suspension was pressure-filtered through a 200-mesh (0.074 mm) screen. It had a viscosity of 3300 cps. and it was readily coated, coalesced, laminated, imaged, developed, etched, and stripped as in Example 1. Similar products were obtained using, as the amine additive, triethyl amine, dimethyl octyl amine, triethanolamine, or N-ethyl morpholine.

EXAMPLE 9

Binder powder prepared as in Example 1 was used to make a plastisol by the procedure of Example 2 in a formulation that comprised 11.1 g binder powder, 8.75 g trimethylolpropane trimethacrylate, 2.00 g tricresyl phosphate, 2.00 g di-n-butyl phthalate, 1.00 g bis(2-o-chlorophenyl-4,5-diphenyl)imidazole, 0.05 g leuco crystal violet, 0.05 g benzotriazole, 0.0375 g C. I. Solvent Red 109, and 0.0125 g Michler's ketone. This solvent-free plastisol was strained through a 100-mesh (0.149 mm) screen. It had a viscosity of 5920 cps. initially, 19,000 cps. after 3 days at room temperature and 340,000 cps. after four weeks at room temperature. It was coated, coalesced, laminated, imaged, developed, etched and stripped as in Example 1.

EXAMPLE 10

Binder powder prepared as in Example 2 was used to make an organosol by the procedure of Example 2 in a formulation that comprised 11.1 g binder powder, 8.75 g trimethylolpropane trimethacrylate, 1.00 g bis(2-o-chlorophenyl-4,5-diphenyl)imidazole, 0.05 g leuco crystal violet, 0.05 g benzotriazole, 0.0375 g. C. I. Solvent Red 109, 0.0125 g Michler's ketone and 5.00 ml methyl chloroform. The resultant organosol had a viscosity of 1600 cps. It was held one day at room temperature, then evacuated to 3 mm Hg during 9 minutes to remove the diluent. The resultant plastisol, at the unusually high solids/liquid ratio of 58/42, was still fluid and remained fluid for three days at room temperature. It was coated, coalesced, laminated, imaged, developed, etched and stripped as in Example 1.

EXAMPLE 11

A binder powder prepared as in Example 2 was mixed with an equal weight of dibutyl phthalate. The resultant soft, translucent paste was coated at 1 mm thickness on glass and coalesced by heating for 5 minutes at 120° C. to give a clear, dry, soft, pliable film.

EXAMPLE 12

One part of binder powder prepared as in Example 2 was mixed with 0.6 part of a commercially available polyoxyethylated long chain alcohol, 0.2 part of a commercially available polyoxyethylene sorbitan monolaurate, and 0.2 part of methylene-bis-(4-cyclohexyl isocyanate). The resultant white paste was coated on glass at 1 mm thickness and heated for 5 minutes at 120° C. It coalesced to give a clear, soft film that swelled 12.5% by volume when immersed in 5% aqueous sodium carbonate. The product was suitable for use as a binder for silver halide photographic systems. This example illustrates a crosslinkable formulation.

EXAMPLE 13

Binder powder prepared as in Example 1 was used to make a plastisol by the procedures of Example 2, using 44.4 g of the binder powder, 35.0 g trimethylolpropane triacrylate, 12.0 g tricresyl phosphate, 4.0 g triethylene glycol diacetate, 4.0 g bis[2-o-chlorophenyl-4,5-bis(m-methoxyphenyl)]imidazole, 0.2 g leuco crystal violet, 0.2 g benzotriazole, 0.15 g C. I. Solvent Red 109 and 0.05 g Michler's ketone. The resultant plastisol was a viscous paste. After it was debubbled under vacuum, it was coated at 0.1" (2.5 mm) on 0.001"-thick (0.025 mm) polyethylene terephthalate film and heated for 10 minutes at 120° C. It coalesced to a soft, clear film that was suitable for use as a photoimageable printing plate.

EXAMPLE 14

To a solution of 0.6 g ammonium persulfate in 500 g of water was added 19 ml of a solution of 11 g methacrylic acid plus 1.1 g dodecyl mercaptan in 100 ml methyl methacrylate. The suspension was stirred vigorously under nitrogen and heated at 80°-85° C. After 12 minutes, when the initial exotherm had subsided, the remainder of the methacrylic acid/dodecyl mercaptan/methyl methacrylate solution was added dropwise over a period of 8 hours. After further heating and stirring for 30 minutes, the resultant latex was evaporated under nitrogen with stirring at 56°-65° C. The residual powder weighed 100 g and comprised agglomerates of 0.3 μm spheres. It was comminuted in a mortar, held for 24 hours at room temperature over concentrated aqueous ammonium hydroxide, and then dried for 24 hours at room temperature over sodium hydroxide pellets. Weight gain was 1.6%, i.e., 70% of the theoretical amount for complete conversion of all —COOH groups to —COONH$_4$ groups. Predrying of the ammonia-treated powder was found to be necessary for the preparation of plastisols with best filterability and lowest ultimate viscosity. It was also found that, in general, such predrying should be carried out for a period at least as long as was the previous NH$_4$OH treatment.

The powder so prepared was used to make an organosol comprising 11.1 g of the powder, 8.75 g trimethylolpropane triacrylate, 2.0 g tricresyl phosphate, 1.0 g bis(2-o-chlorophenyl-4,5-diphenyl)imidazole, 0.05 g leuco crystal violet, 0.05 g benzotriazole, 0.0375 g C. I. Solvent Red 109, 0.0825 g Michler's ketone and 5 ml chloroform diluent. The procedures outlined in Example 2 were followed, with the added precaution that the mixture was protected from ambient humidity by blanketing with dry nitrogen during the 0° C. milling step. This precaution served to improve filterability and reduce ultimate viscosity. After pressure-filtering through nylon flannel, the organosol had a viscosity of 200 cps. (Brookfield, No. 5 spindle, 100 rpm). It was then held under oil-pump vacuum at room temperature. After 20 minutes, the bubbles and diluent had been removed, and the final vacuum was 2 mm Hg. The residual plastisol was dilatant, with Brookfield No. 5 viscosities of 1176 cps. at 100 rpm and 832 cps. at 50 rpm. It was again pressure-filtered through nylon flannel and then coated at a thickness of 0.002" (0.05 mm) on 0.001"-thick (0.025 mm) polyethylene terephthalate film and coalesced by heating for one minute at 100° C. The coating and coalescing steps were carried out seriatim in a continuous operation on a conventional endless-belt film-coating machine, wherein the freshly coated plastisol was coalesced by passage at 12 ft./min. (3.6 m/min.) through a 12-foot (3.6 m) drying oven maintained at 212° F. (100° C.). The resultant 0.002" (0.05 mm) coating was smooth and uniform. It was laminated, imaged, developed, etched and stripped as in Example 1. The plastisol was stable for many months at room temperature without significant increase in viscosity, yet it was readily coalesced when heated to 100°-120° C. after such protracted storage periods.

EXAMPLE 15

Polymer powder prepared as in Example 2 was held for 15 minutes at 25° C. under 1 atmosphere of anhydrous ammonia vapor. Weight gain was 3.3%. A plastisol prepared as in Example 14 resembled that of Example 14 except that it was somewhat more difficult to filter without plugging. Similar results were obtained with polymer powder that had been held for three hours at room temperature under anhydrous ammonia and then air-dried for four hours. Thus, while anhydrous ammonia is operable, aqueous ammonia is sometimes preferable. It is also possible, but less desirable, to carry out the ammonia treatment by adding an excess of aqueous ammonium hydroxide to the polymer latex prior to isolation of the polymer powder by filtration or evaporation, but the products are difficult to comminute and to disperse in plastisol formulations.

EXAMPLE 16

To a solution of 0.4 g ammonium persulfate in 400 g water was added 28.6 ml of a solution of 20 g methacrylic acid plus 1.07 g dodecyl mercaptan in 80 g of methyl methacrylate. The suspension was stirred vigorously under nitrogen and heated at 80°-85° C. At 30-minute intervals, there was added 20 ml of the methyl methacrylate/methacrylic acid/dodecyl mercaptan solution plus 25 ml of a solution of 0.2 g ammonium persulfate in 100 ml water. Thirty minutes after the fourth such addition, the reaction was terminated by admitting air and cooling to room temperature. The latex was dried at 55°-66° C. under a stream of nitrogen with stirring, and the residual powder was ground in a mortar, passed through a 40-mesh (~0.38 mm) screen and held for 20 hours in an atmosphere of ammonia. The powder was soluble in the monobutyl ether of ethylene glycol. It was insoluble in methyl chloroform, carbon tetrachloride, chloroform, methylene chloride and perchloroethylene. It was used to make an organosol as in Example 14.

EXAMPLE 17

A methyl methacrylate/methacrylic acid (95/5) copolymer powder was prepared substantially as described in Example 2, using 95 g methyl methacrylate, 5 g methacrylic acid, and 2 g dodecyl mercaptan. The polymer powder was held for 20 hours at room temperature over concentrated aqueous ammonium hydroxide, then dried for 20 hours over sodium hydroxide pellets. An organosol was prepared as in Example 14, using 13.75 g of the binder powder, 8.75 g trimethylolpropane triacrylate, 2.125 g triethylene glycol diacetate, 0.165 g benzophenone, 0.0825 g Michler's ketone, 0.025 g benzotriazole, 0.11 g C. I. Solvent Red 109, and 8 ml methyl chloroform. The organosol was filtered through nylon flannel at 0° C., coated on 0.001"-thick (0.025 mm) polyethylene terephthalate film at a thickness of 0.001" (0.025 mm) and coalesced by heating for 5 minutes at 120° C. to give a 0.0006" (0.015 mm) coating that was laminated, exposed, developed, etched and stripped as in Example 1.

EXAMPLE 18

Polymer Preparation

A methyl methacrylate/methacrylic acid (98/2) copolymer powder was prepared essentially as described in Example 2, using 98 g methyl methacrylate, 2.0 g methacrylic acid and 2.0 g dodecyl mercaptan. The polymer powder was isolated by drying at 63° C., then it was held for 19 hours over concentrated aqueous ammonium hydroxide and dried for 21 hours over sodium hydroxide pellets. Weight gain indicated that 0.5% $NH_3$ was combined. Examination in the electron microscope indicated a particle size of 0.2-0.4 μm. The powder ($T_g = \sim 122°$ C.) was partly soluble at room temperature in methyl chloroform, swollen but insoluble in perchloroethylene.

Liquid Premix

A mixture of 29.0 g trimethylolpropane triacrylate, 4.3 g dioctyl phthalate, 4.3 g triethylene glycol diacetate, 4.3 g tricresyl phosphate, 4.0 g bis(2-o-chlorophenyl-4,5-diphenyl)imidazole, 0.2 g benzotriazole, 1.0 g Michler's ketone, 0.3 g tris(4-diethylamino-o-tolyl)methane. 0.11 g leuco crystal violet, 0.03 g C. I. Basic Blue 7 (C. I. No. 42595) and 31.8 g methyl chloroform was stirred for 18 hours at room temperature, then pressure-filtered through nylon flannel.

Preparation of Organosol:

A mixture of 19.95 g of the above liquid premix, 13.0 g of the above binder powder, and 25 ml of 20-30 mesh (~0.55-0.85 mm) sand was milled for 30 minutes at 0° C. under nitrogen, then pressure-filtered at 0° C. The organosol had a viscosity at 0° C. of 10,320 cps. initially, 3600 cps. after 5 hours at 5° C., and 4600 cps. after 22 hours at 5° C. When held at room temperature, viscosity was 36,800 cps. after one hour and >800,000 cps. after two hours. The orgnosol was used for the preparation of photoresists as described in the preceding examples.

EXAMPLE 19

Preparation of Seed Polymer Latex

A solution of 31 g ethyl acrylate plus 8 g methacrylic acid in 61 g methyl methacrylate was added to a solution of 0.6 g ammonium persulfate in 500 g water. The suspension was blanketed with nitrogen and stirred vigorously for two hours at 80-85° C. The resultant latex was strained through nainsook fabric and held as "seed polymer latex".

Preparation of Copolymer Powder

A suspension of 30 g of the seed polymer latex in a solution of 0.6 g ammonium persulfate in 400 g water was blanketed with nitrogen, stirred vigorously and heated to 40° C. To this was added a solution of 0.025 g ferric ammonium sulfate hexahydrate in 25 g water plus a solution of 7.75 g ethyl acrylate, 2.0 g methacrylic acid, and 0.975 g dodecyl mercaptan in 15.25 g methyl methacrylate. Three similar additions were made at one-hour intervals. Thirty minutes after the final such addition, the latex was strained through nainsook fabric and held at room temperature for 10 days. It was then reheated to 40° C. under nitrogen and stirred and to it was added 5 g methacrylic acid, 0.1 sodium bisulfite, and a solution of 0.1 g ammonium persulfate in 200 g water. After one hour at 40° C., the latex was evaporated under nitrogen with stirring at 25°-40° C. for two days. The residual solid was ground in a mortar, passed through a 40-mesh (~0.38 mm) screen and held for 20 hours over concentrated aqueous ammonium hydroxide. Microscopic examination indicated a particle size of 0.5–9.0 μm.

The powder was used to make a plastisol as described in Example 2. The plastisol remained fluid when held for one day at 5° C. It set up to a firm gel in two hours at room temperature.

EXAMPLE 20

A solution of 0.2 g ammonium persulfate in 100 g water was stirred under nitrogen and to it was added 29 ml of a solution of 5 g methacrylic acid plus 2 g dodecyl mercaptan in 95 g methyl methacrylate. The suspension was held at 80°–90° C. for 30 minutes then at 30-minute intervals there was added 20 ml of the methacrylic acid/dodecyl mercaptan/methyl methacrylate solution plus 80 ml of a solution of 0.1 g ammonium persulfate in 320 ml water. Thirty minutes after the last such addition, the latex was evaporated under nitrogen with stirring at 65° C. The resultant solid was ground in a mortar, passed through a 40-mesh (~0.38 mm) sieve, held one day over concentrated aqueous ammonium hydroxide, then held for one day over sodium hydroxide pellets.

A mixture of 87.5 g trimethylolpropane trimethacrylate, 20.0 g tricresyl phosphate, 10.0 g bis(2-o-chlorophenyl-4,5-diphenyl)imidazole, 0.5 g leuco crystal violet, 0.5 g benzotriazole, 0.375 g C. I. Solvent Red 109, and 0.125 g Michler's ketone was stirred for about 16 hours at room temperature, then milled for 30 minutes at 0° C. under nitrogen with 100 ml of 20–30 mesh (~0.55–0.85 mm) sand, and pressure-filtered through nylon flannel. An 11.9 g sample of this premix was stirred at 0° C. and 11.1 g of the polymer powder was added portion-wise. The resultant soft paste was held for 20 hours at room temperature. It became a flowable dispersion with a Brookfield No. 5 viscosity of 15,440 cps. at 20 rpm. An equal volume of 20–30 mesh (~0.55–0.85 mm) sand was added, and the suspension was milled for 30 minutes at 0° C. under nitrogen. It was then pressure-filtered through a 325-mesh (0.044 mm) screen. The filtrate had a Brookfield No. 5 viscosity of 18,200 cps. and remained uncoalesced for many days at room temperature. It was coated, coalesced at 120° C., laminated, imaged, developed, etched and stripped as in Example 1.

EXAMPLE 21

To a solution of 0.2 g ammonium persulfate in 100 g water was added 29 ml of a solution of 5 g methacrylic acid and 2 g dodecyl mercaptan in 95 g methyl methacrylate. The suspension was blanketed with nitrogen, stirred and heated under reflux at 80°–90° C. At 30-minute intervals, there was added 20 ml of the methyl methacrylate/methacrylic acid/dodecyl mercaptan solution plus 80 ml of a solution of 0.1 g ammonium persulfate in 320 ml water. Thirty minutes after the fourth such addition, the reaction was terminated by opening to air and cooling to room temperature. A portion of the resultant milky latex was evaporated to dryness. The residue comprised 99% of the theoretical yield for complete polymerization.

A second polymerization was carried out as just described except that the initial charge comprised 0.2 g ammonium persulfate, 79.6 g water, and 20.4 g of the latex of the first polymerization to provide 4 g of polymer seed, i.e., 4% of the weight of the methyl methacrylate/methacrylic acid/dodecyl mercaptan used in the second polymerization.

After the second polymerization was complete, the latex was evaporated to dryness under nitrogen with stirring in a 55° C. water bath. The residue weighed 104 g (98% yield). It was ground in a mortar and passed through a ⅛"-mesh (3.2 mm) sieve. A 33.5 g portion was loaded into a column and anhydrous ammonia gas was passed slowly through the bed of powder for 30 minutes. Weight gain was 2.1%, vs. a theoretical maximum of 1.2% for complete conversion of the available -COOH groups to —COONH$_4$, the excess probably being attributable to absorption.

A solution of 48 g tricresyl phosphate, 16.0 g benzophenone, 0.8 g Michler's ketone, 0.8 g bis(2-o-chlorophenyl-4,5-diphenyl)imidazole, 0.8 g benzotriazole, 0.4 g tris(4-diethylamino-o-tolyl)methane, 0.2 g leuco crystal violet, and 0.28 g C.I. Basic Blue 7 (C. I. No. 42595) in 120 g trimethylolpropane triacrylate that contained 500 ppm hydroquinone was prepared by stirring for about 16 hours at room temperature. To 11.7 g of this solution there was added portionwise with stirring 12.5 g of the ammonia-treated binder powder. The suspension was cooled in an ice bath and blanketed with nitrogen, and 20 ml of 20–30 mesh (~0.55–0.85 mm) sand was added portionwise with disc-stirring at 1000 ft./min. (~300 m/min.) peripheral speed. After stirring for one hour, the plastisol was separated from the sand by filtration through nylon flannel and was found to have a Brookfield No. 5 viscosity of 820 cps. at 20 rpm initially, 1400 cps. after standing 24 hours at room temperature, and 2460 cps. after further stirring after 24 hours at room temperature. The plastisol was used to make photoimaging circuit board resists in the manner described in preceding examples.

Substantially similar results were obtained when the amount of seed polymer was varied between 1% and 5% of the amount of the plastisol-forming powder. Beyond these limits, diluent-free plastisols were much more difficult to filter.

EXAMPLE 22

A solution of 31 g of ethyl acrylate plus 8 g of methacrylic acid in 61 g of methyl methacrylate was added to a solution of 0.6 g ammonium persulfate in 500 g water. The suspension was blanketed with nitrogen and stirred vigorously for two hours at 80°–85° C. The resultant latex was strained through nainsook fabric and held as "seed polymer latex".

A suspension of 30 g of the seed polymer latex in a solution of 0.6 ammonium persulfate in 400 g water was blanketed with nitrogen, stirred vigorously, and heated to 40° C. To this was added a solution of 7.75 g ethyl acrylate, 2 g methacrylic acid and 0.975 g dodecyl mercaptan in 15.25 g methyl methacrylate. Three more such additions were made at one-hour intervals. Thirty minutes after the final addition, the latex was strained through nainsook fabric and held at room temperature for 10 days. It was then reheated to 40° C. under nitrogen and stirred and to it was added 5 g methacrylic acid, 0.1 g sodium bisulfite, and a solution of 0.1 g ammonium persulfate in 200 g water. After one hour at 40° C., the latex was evaporated under nitrogen with stirring at 25°–40° C. for two days. The residual solid was ground in a mortar, passed through a 40-mesh (~0.38 mm) screen, and held for 20 hours over concentrated aqueous ammonium hydroxide. Microscopic examination indicated a particle size of 0.5–9.0 μm.

An 11.1 g sample of the binder powder prepared as just described was added to a mixture of 8.75 g trimethylolpropane trimethacrylate, 2 g tricresyl phosphate, 1 g bis(2-o-chlorophenyl-4,5-diphenyl)imidazole, 0.05 g leuco crystal violet, 0.05 g benzotriazole, 0.0375 g C. I. Solvent Red 109, 0.0125 g Michler's ketone, and 7.5 ml carbon tetrachloride. An equal volume of 20–30 mesh (~0.55–0.85 mm) sand was added and the mixture was milled for 30 minutes at 0° C. with a disc impeller running at a peripheral speed of 1000 ft./min. (~300 m/min.). The resultant organosol remained fluid when held for one day at 5° C., but set up to a firm gel in two hours at room temperature.

EXAMPLE 23

A methyl methacrylate/methacrylic acid (93/7) copolymer powder was prepared by procedures like those of Example 4, using 93 g methyl methacrylate, 7 g methacrylic acid and 2 g dodecyl mercaptan. The powder was isolated from the latex by drying at 55°–66° C., ground in a mortar, held for 24 hours over concentrated aqueous ammonium hydroxide, then held for 24 hours over sodium hydroxide pellets. It was used to make an organosol in the formulation and by the procedures given in Example 18. The organosol was filtered through nylon felt at 0° C., and had viscosities of 200 cps. initially, 292 cps. after 5 hours at 5° C., and 824 cps. after 24 hours at 5° C. When the organosol was held at 25° C., viscosity rose as follows:

| | |
|---|---|
| Initial | 300 cps. |
| After 15 min. | 344 cps. |
| After 30 min. | 520 cps. |
| After 1 hour | 1052 cps. |
| After 2.5 hour | 3560 cps. |
| After 5 hour | 86,400 cps. |
| After 6 hour | 380,000 cps. |

I claim:

1. A thermally coalescible non-aqueous resin dispersion plastisol or organosol of single-phase particles of a random polymer or copolymer which comprises an organic polyelectrolyte that contains at least 1% by weight of an ionizable monomer or comonomer, said organic polyelectrolyte being polymer produced by the addition polymerization of ethylenically unsaturated monomer, dispersed in a medium that comprises a liquid that is nonvolatile at room temperature and is compatible with and a plasticizer for the resin, the liquid portion of said dispersion containing a photopolymerizable ethylenically unsaturated monomeric compound and at least one photoinitiator, said dispersion being coalescible to a clear dry film containing said organic polyelectrolyte and liquid plasticizer.

2. A dispersion according to claim 1 wherein the organic polyelectrolyte comprises at least 50% by weight of the polymer or copolymer.

3. A dispersion according to claim 1 wherein the photopolymerizable ethylenically unsaturated monomeric compound is a polyfunctional acrylic or methacrylic monomer.

4. A dispersion according to claim 1 wherein the liquid medium is free of surfactant containing ether groups or long-chain acid groups.

5. A thermally coalescible nonaqueous resin dispersion plastisol or organosol of single-phase particles of a random polymer or copolymer which comprises an organic polyelectrolyte that contains at least 1% by weight of an ionizable monomer or comonomer, the particles of said organic polyelectrolyte being ionic acrylic resin containing at least 80% by weight of acrylic units, dispersed in a medium that comprises a liquid that is nonvolatile at room temperature and is compatible with and a plasticizer for the resin, the liquid portion of said dispersion containing a photopolymerizable ethylenically unsaturated monomeric compound and at least one photoinitiator, said dispersion being coalescible to a clear dry film containing said organic polyelectrolyte and liquid plasticizer.

6. A dispersion according to claim 5 wherein the polymeric particles are salts of methyl methacrylate/methacrylic acid copolymers in ratios by weight of 80:20 to 99:1.

7. A dispersion according to claim 6 wherein the salts are ammonium salts of the copolymers.

8. A dispersion according to claim 6 wherein the salts are amine salts of the copolymers.

9. A dispersion according to claim 3 wherein the ethylenically unsaturated monomeric compound is trimethylolpropane triacrylate.

10. A dispersion according to claim 3 wherein the ethylenically unsaturated monomeric compound is trimethylolpropane trimethacrylate.

11. A photopolymerizable element which comprises a support bearing a coalesced layer of the dispersion according to claim 1.

* * * * *